United States Patent
Koh et al.

(10) Patent No.: US 6,831,497 B2
(45) Date of Patent: Dec. 14, 2004

(54) ACTIVE QUADRATURE SIGNAL GENERATOR USING LOAD HAVING LOW-PASS AND HIGH-PASS FILTER CHARACTERISTICS

(75) Inventors: Kwang Jin Koh, Daejon-Shi (KR); Hyun Kyu Yu, Daejon-Shi (KR)

(73) Assignee: Electronics and Telecommunications Research Institute, Daejon-shi (KR)

( * ) Notice: Subject to any disclaimer, the term of this patent is extended or adjusted under 35 U.S.C. 154(b) by 0 days.

(21) Appl. No.: 10/179,491

(22) Filed: Jun. 24, 2002

(65) Prior Publication Data

US 2003/0117200 A1 Jun. 26, 2003

(30) Foreign Application Priority Data

Dec. 26, 2001 (KR) ........................................ 2001-85164

(51) Int. Cl.[7] .............................................. H03H 11/16
(52) U.S. Cl. ........................ 327/254; 327/238; 327/256
(58) Field of Search ................................. 327/254, 257, 327/264, 266, 268, 357, 237, 238; 455/302, 326

(56) References Cited

U.S. PATENT DOCUMENTS

| | | | | |
|---|---|---|---|---|
| 5,448,772 A | * | 9/1995 | Grandfield | .................. 455/333 |
| 5,847,623 A | * | 12/1998 | Hadjichristos | ............... 332/105 |
| 6,078,802 A | | 6/2000 | Kobayashi | .................. 455/326 |
| 6,148,184 A | | 11/2000 | Manku et al. | ............... 455/110 |
| 6,211,708 B1 | * | 4/2001 | Klemmer | ..................... 327/122 |
| 6,226,509 B1 | * | 5/2001 | Mole et al. | .................. 455/302 |
| 6,369,633 B1 | * | 4/2002 | Tsukahara | ................... 327/254 |

OTHER PUBLICATIONS

2001 IEEE Journal of Solid–State Circuits, vol. 36, No. 6, Jun. 2001, "CMOS Mixers and Polyphase Filters for Large Image Rejection", F. Behbahani, et al, 15 pages.

* cited by examiner

*Primary Examiner*—Minh Nguyen
(74) *Attorney, Agent, or Firm*—Blakely Sokoloff Taylor & Zafman LLP

(57) ABSTRACT

An active quadrature signal generator produces poly-phase quadrature signals necessary in high frequency transmit and receive elements of a communication system. The quadrature signals are produced using the phase difference between a load representing a low-pass filter characteristic and a load representing a high-pass filter characteristic and the quadrature signal is then used in the differential structure to produce amplified signal having 4 quadrature phases. The device can reduce a loss characteristic of the signal and additional power consumption for compensating for it in a common poly-phase quadrature filter having only conventional resistors and capacitor.

8 Claims, 18 Drawing Sheets

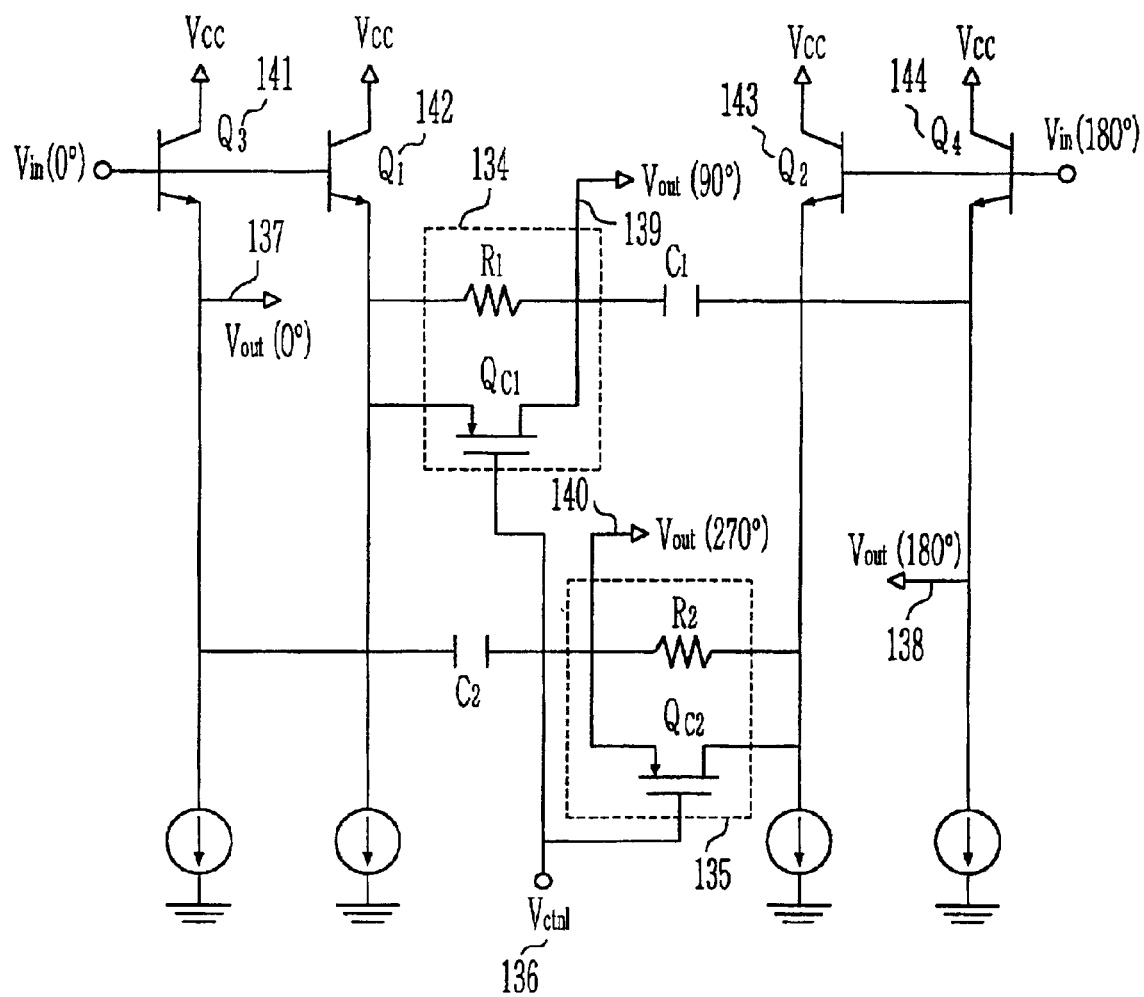

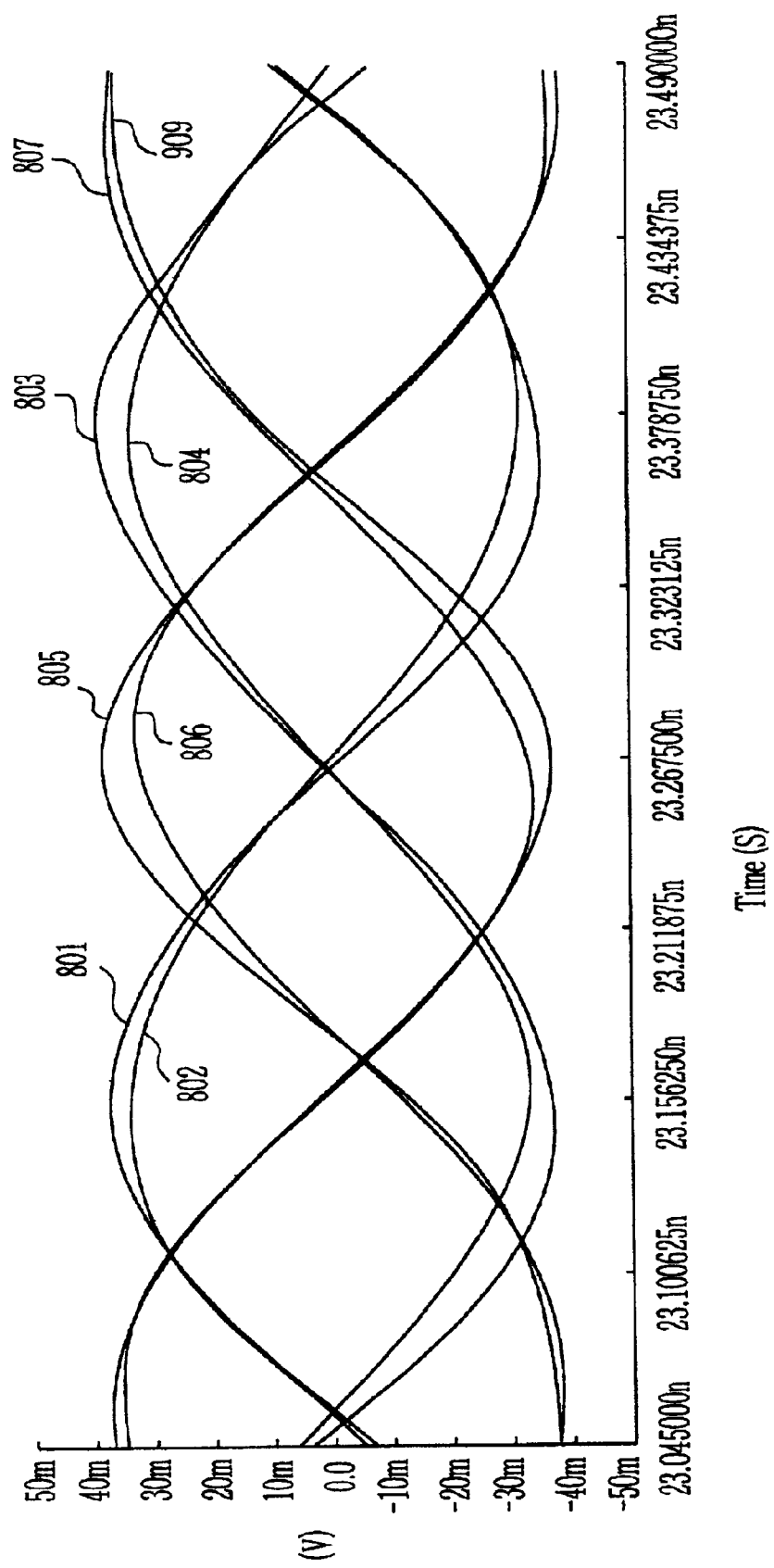

ACTIVE QUADRATURE SIGNAL GENERATOR USING LOAD HAVING LOW-PASS AND HIGH-PASS FILTER CHARACTERISTICS

BACKGROUND OF THE INVENTION

1. Field of the Invention

The invention relates generally to a semiconductor circuit, and more particularly to a circuit for producing poly-phase quadrature signals necessary in high frequency transmitter and receiver of a communication system, in which the quadrature signals are produced using the phase difference between a load having a low-pass filter characteristic and a load having a high-pass filter characteristic and the quadrature signal is then used in the differential structure to produce amplified signal having 4 quadrature phases.

2. Description of the Prior Art

In a digital communication system, generally, if the frequency band of a signal to be transmitted does not match with the property of a medium, it is required that the signal be moved to an adequate frequency band and then transmitted. Among modulation methods, as identifying the phase difference of 180° is much easier than identifying variations in the frequency, phase shift-keying (PSK) technique has been widely employed. In a modern high-speed communication system for processing a lot of data, quadrature phase shift-keying(QPSK) technique which four values can be identified by a single symbol with phase shift by 90° has been widely used. In this QPSK technique, the phase shift by 90° of a series of binary data pair can be generated by a pair of a mixer using a carrier wave of a cosine component and a mixer using a carrier wave of a sine component. At this time a poly-phase quadrature signal generator produces the quadrature signals of sine wave and cosine wave.

FIG. 1a shows a conventional poly-phase quadrature signal generator of the most simple structure. The poly-phase quadrature signal generator includes two resistors 104 and 107, and two capacitors 105 and 106. If differential input signals $v_{in}$ (0°), $v_{in}$ (180°) are inputted through input terminals 100 and 101, differential output signals $v_{out}$ (90°), $v_{out}$ (270°) are produced through the output terminals 102 and 103. At this time, assuming that $R_1=R_2=R$ and $C_1=C_2=C$, the transfer function between the input and the output is expressed as follows: $V_{out}*/V_{in}*=(1-sRC)/(1+sRC)$. As a result, phase shifts by $-2\tan^{-1}\omega RC$. $V_{in}*$ and $V_{out}*$ represent the differential input signals $v_{in}$ (0°), $v_{in}$ (180°) and $v_{out}$ (90°), $v_{out}$ (270°), respectively. s indicates $j\omega$ and $\omega$ indicates an angular frequency. Therefore, when $\omega=1/RC$, the output is the differential quadrature signal (poly-phase quadrature signal) having same amplitude and phase difference of 90° compared with the input. In a typical integrated circuit manufacturing process, however, there exist errors in the amplitude and phase as the range in an error of the resistor and the capacitor is high. In order to correct the errors between the quadrature signals, therefore, it is required that a variable resistor or a variable capacitor be used.

Hereinafter, signals having relative phases of 0° and 180° are called I-signal (in-phase signal) and signals having relative phases of 90° and 270° are called a Q-signal (quadrature-phase signal), according to common high frequency communication terminology.

FIG. 1b illustrates a conventional poly-phase quadrature filter. Resistors 118~121 and capacitors 126~129 form a first order filter network. Also, resistors 122~125 and capacitors 130~133 form a second order filter network. However, a high order filter network can be designed depending on its purposes. If the values of the resistors forming respective filter networks are same and are called R, and the values of the capacitors are same and are called C, the transfer function of the output signal to the differential input signal $v_{in}$ (0°), $v_{in}$ (180°) when the differential input signal $v_{out}$ (90°), $v_{out}$ (270°) is grounded can be expressed as Equation 1.

$$V_{I\_out}*/V_{in}*=2sRC/\{(sRC)^2+4sRC+1\},$$

$$V_{Q\_out}*/V_{in}*=\{1-(sRC)^2\}/\{(sRC)^2+4sRC+1\} \qquad \text{[Equation 1]}$$

where, $V_{I\_out}*$ is the differential output signal, $v_{out}$ (0°), $v_{out}$ (180°), in other words, the I-signal. Also, $V_{Q\_out}*$ is the differential output signals, $v_{out}$(90°) and $v_{out}$(270°), in other words, the Q-signal. As the poly-phase quadrature filter is basically a passive circuit network, attenuation of the signal becomes great as the order of the circuit network is increased. The errors of the amplitude and the phase of the differential quadrature signal are also significantly increased by errors in the manufacturing process of the resistors and the capacitors. As shown in Equation 1, the I-signal represents a low-pass characteristic and the Q-signal represents a high-pass characteristic. Thus, as the frequency characteristics of the two differential quadrature signals are different, there exists difference in the modulation of the I-signal and the Q-signal by the low-frequency coupling or the high-frequency coupling due to the leakage, which causes errors in the amplitude and the phase. In order to generate exact differential quadrature signal in a desired frequency range, therefore, there is a need for a quadrature signal generator having a bandpass characteristic through which corresponding frequency components are passed but unnecessary signal by the leakage are rejected.

FIG. 1c shows a modified version of the poly-phase quadrature signal generator in FIG. 1a. Transistors 141~144 which are bipolar junction transistors(BJT) operate as an input buffer. A P type MOSFET Qc1 and Qc2 which are driven in a linear region, and resistors $R_1$ and $R_2$, are connected in parallel to form variable resistors 134 and 135. Thus, the gate voltage of the P type MOSFET is varied to control the effective resistor value, so that errors in the amplitude and the phase between two differential quadrature signals(I-signal and Q-signal) can be controlled. At this time, necessary control voltage is supplied from the outside through a node 136. As this type of the structure basically includes the resistors and the capacitors, the pole frequency is increased as the frequency is increased. Therefore, desired values of the resistors and capacitors become small. Consequently, there are problems that the structure could not be reliably implemented and implementation at the high frequency band is limited.

SUMMARY OF THE INVENTION

The present invention is contrived to solve the above problems and an object of the present invention is to provide a quadrature signal generator by which amplified quadrature signals are produced using a load having a low-pass filter characteristic using resistors and capacitors and a load having a high-pass filter characteristic using the resistors and inductors in a signal amplifier structure and variation in the phase representing respective loads, and quadrature signals are produced by implementing it as the differential structure, thus controlling amplitude errors and phase errors using a variable resistor and a variable condenser and removing signal errors(amplitude errors, phase errors) by coupling the bandpass resonators.

Another object of the present invention is to provide a quadrature signal generator that can be used in microwave and millimeter-wave regions as well as the radio frequency (RF) region, using an inductor other than an existing resistors-the capacitor structure.

In order to accomplish the above object, a quadrature signal generator according to the present invention, comprising a means for generating two-phase quadrature signals using a low-pass filter having resistors and a capacitors and a high-pass filter having resistors and a inductors, and a differential amplifier for generating amplified poly-phase quadrature signals, wherein the low-pass filter and the high-pass filter are connected to respective loads.

The values of the resistors and the capacitor in the low-pass filter are varied depending on the amplitude and phase of signal to be obtained and wherein the values of the resistors in the high-pass filter are varied depending on the amplitude and phase of a signal to be obtained.

The active quadrature signal generator further includes a resonator having a bandpass characteristic connected between the input terminals of the differential amplifier and having capacitors and inductors. The active quadrature signal generator further includes a poly-phase quadrature filter connected between of poly-phase quadrature signal output terminals and having passive devices. The active quadrature signal generator further includes a phase control means for controlling the values of the resistors in the high-pass filter in order to finely control the phase error of the poly-phase quadrature signal.

The phase control means includes a phase sensing means of a single parallel structure for sensing the difference in the phases between a relative phase 0° and a relative phase 90° or a relative phase 180° and a relative phase 270° among the poly-phase quadrature signals; a low-pass filter for removing a high frequency portion from the signals outputted from the phase sensing means; an averaging circuit for adding by weight a single output signal passed through the phase sensing means for sensing the difference in the phase between the relative phase 0° and the relative phase 90° and the low-pass filter, and a single output signal passed through the phase sensing means for sensing the difference in the phase between the relative phase 180° and the relative phase 270° and the high-pass filter; and a comparator circuit for comparing the output signal from the averaging circuit and a reference voltage to produce a voltage for controlling the resistors and the capacitors.

The phase control means includes a phase sensing means of a dual balanced structure capable of sensing the difference in the phases between the relative phase 0° and the relative phase 90° or the relative phase 180° and the relative phase 270° among the poly-phase quadrature signals; a low-pass filter for removing a high frequency portion of the signal outputted from the phase sensing means; a means for converting the differential output signal from the phase sensing means and the low-pass filter into a single output signal; and a comparator circuit for comparing the output signal from the means and a reference voltage to produce a voltage for controlling the resistors and the capacitor.

Further, an active quadrature signal generator according to the present invention, is characterized in that it comprises a first means for in parallel distributing the signal having a relative signal 0° passed through a load having a low-pass filter characteristic into a load having a low-pass filter characteristic and a load having a high-pass filter characteristic to produce signals having a relative signal 0° and a relative signal 270°; a second means for in parallel distributing a signal having a relative signal 180° passed through the load having the low-pass filter characteristic again into the load having the low-pass filter characteristic and the load having the high-pass filter characteristic to produce signals having the relative signal 90° and the relative signal 180°; a third means for differentially connecting the first and second means; a fourth means for in parallel distributing the signal having the relative signal 90° passed through the load having the high-pass filter characteristic again into the load having the low-pass filter characteristic and the load having the high-pass filter characteristic to produce signals having the relative signal 270° and the relative signal 90°; a fifth means for in parallel distributing the signal having the relative signal 270° passed through the load having the high-pass filter characteristic again into the load having the low-pass filter characteristic and the load having the high-pass filter characteristic to produce signals having the relative signal 0° and the relative signal 180°; and a sixth means for differentially connecting the fourth and fifth means.

The active quadrature signal generator further includes a means for adding by weight the signal passed through the load having the high-pass characteristic having the same relative phase to the signal passed through the load having the low-pass characteristic.

BRIEF DESCRIPTION OF THE DRAWINGS

The aforementioned aspects and other features of the present invention will be explained in the following description, taken in conjunction with the accompanying drawings, wherein:

FIG. 1c is a circuit diagram of a conventional active variable quadrature phase shifting circuit;

FIG. 2b illustrates a low-pass circuit and a high-pass circuit for describing the principle of generating the poly-phase quadrature signal in FIG. 2a;

FIG. 4a shows a waveform of a poly-phase quadrature signal of 2.33 GHz that is generated in FIG. 2a;

FIG. 4b is a graph illustrating the phase response depending on the frequency of signals shown in FIG. 4a;

FIG. 4c is a graph illustrating the amplitude response depending on the frequency of signals shown in FIG. 4a;

FIG. 8a is a waveform of a poly-phase quadrature signal that is generated using the resonator in FIG. 5a, the quadrature signal generator in FIG. 2a and the parallel-distributed cross-passing circuit in FIG. 7a;

DETAILED DESCRIPTION OF PREFERRED EMBODIMENTS

The present invention will be described in detail by way of a preferred embodiment with reference to accompanying drawings.

According to the present invention, differential signals(0° and 180°) generated in a voltage-controlled oscillator are inputted to a differential amplifier of a common source type cascode structure. An input signal of a relative phase of 0° is multiplied by the transconductance of the input transistor and is then converted to current. Then, the current flows into a load having characteristics of a low-pass filter as resistors and capacitors are connected in parallel and a load having characteristics of a high-pass filter as resistors and inductors are connected in parallel via cascoded transistor. The currents are multiplied by respective load impedance, respectively, to produce output voltages. The quadrature signals having the difference in the phase of 0° and 90° can be produced by controlling values of the resistors, the capacitors and the inductors so that difference in the phase between the load impedance of the low-pass filter characteristic and the load impedance of the high-pass filter characteristic becomes 90° at a desired frequency band. If an input signal of a relative phase 180° are processed as is mentioned above using remaining input transistors of differential pairs, an output signal having the difference in the phase of 180° and 270° can be produced. Therefore, poly-phase quadrature signals can be generated.

In order to correct the amplitude errors and mismatch of the quadrature phases between the quadrature signals due to difference in characteristics between the load having the low-pass filter characteristic and the load having the high-pass filter characteristic, the quadrature signals are alternately passed through the load having the low-pass filter characteristic and the load having the high-pass filter characteristic. After then, the quadrature signals which are in phase are added considering weight. Further, in order to control mismatch in the quadrature phase that is important in the system application precisely, respective loads are constructed using the variable resistors or the variable capacitors. The degree of the mismatch of the quadrature phase of the output signal is then sensed using a phase detector and a low-pass filter. Next, the degree of the mismatch and a reference voltage are compared by a comparator, and the variable resistor and the variable condenser are then controlled using the compared voltage, thus correcting the phase error.

Further, in order to reduce the signal error of each of the quadrature signals due to the coupling effect, the bandpass resonator for producing resonance at a corresponding frequency is coupled to the circuit. Therefore, the mismatch of the amplitude and the phase of the quadrature signal due to the coupling effect at the low frequency and the high frequency can be prevented.

Figure 1A:
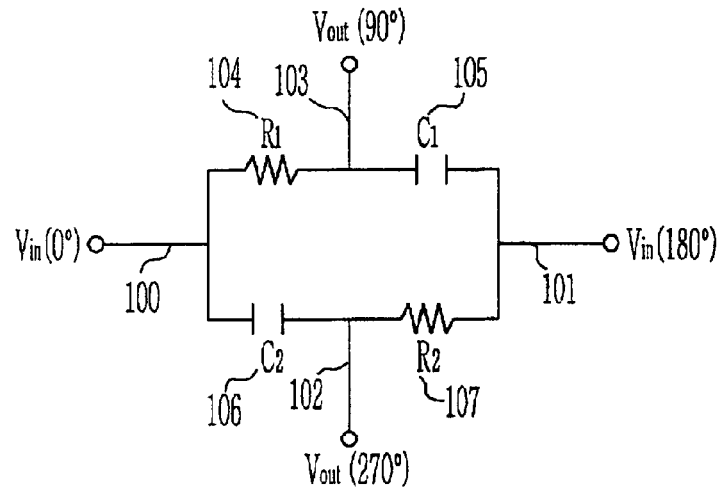
FIG. 1a is a circuit diagram of a conventional passive quadrature phase shifting circuit.
Figure 1B:
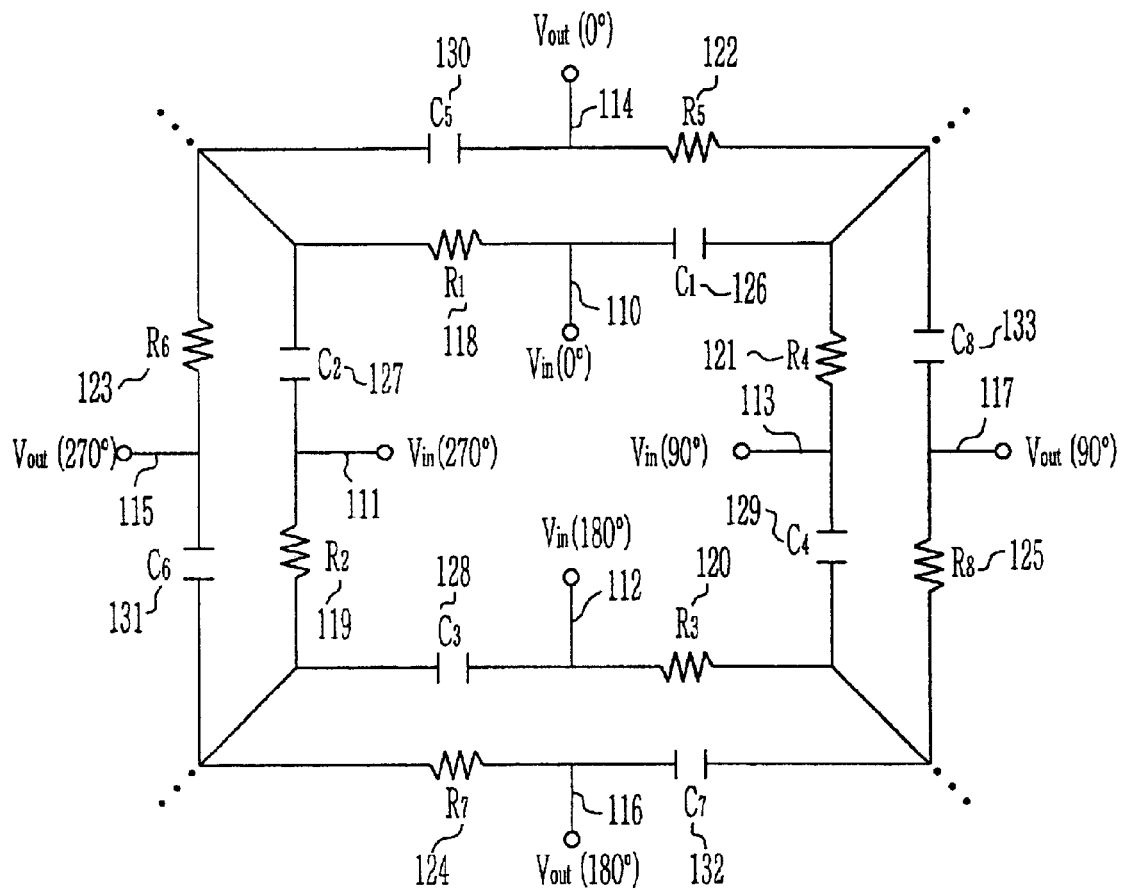
FIG. 1b is a circuit diagram of a conventional poly-phase filter.
Figure 2A:
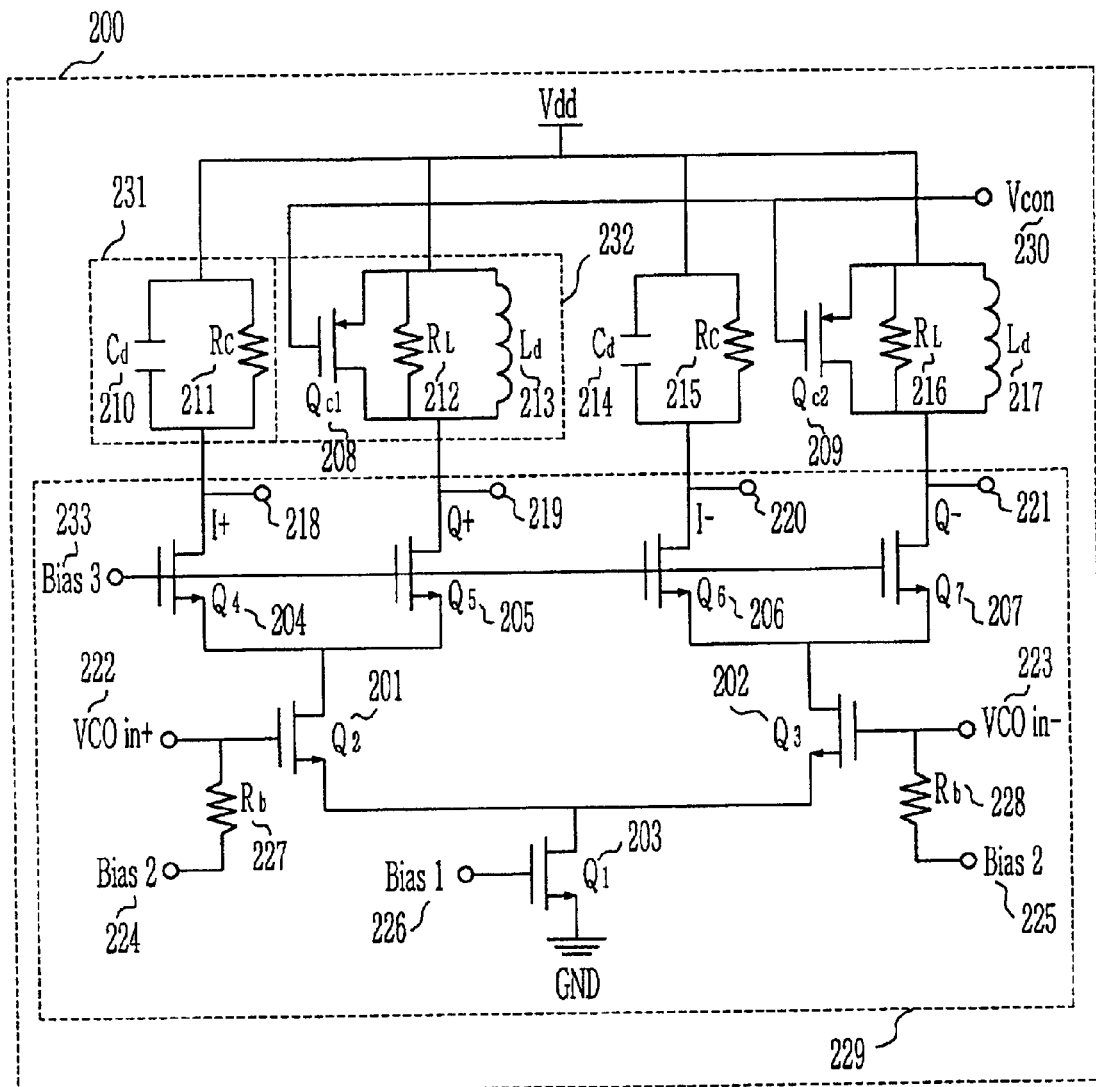
FIG. 2a is a circuit diagram of an active quadrature signal generator according to the present invention.
Figure 2B:
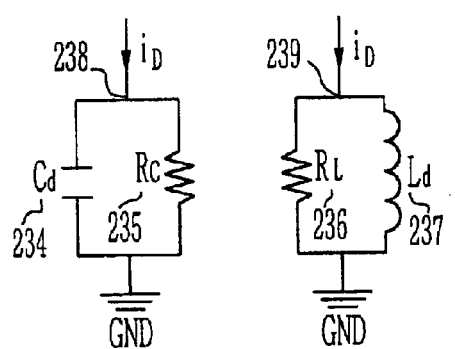

FIG. 2a is a circuit diagram for producing poly-phase quadrature signals using a load having a low-pass filter characteristic and a load having a high-pass filter characteristic according to a preferred embodiment. FIG. 2b illustrate a low-pass filter and a high-pass filter for explaining respective load characteristics.

Referring to FIG. 2a, a portion of the active quadrature signal generator comprises a cascoded differential amplifier 204, 205 and loads 231, 232. The cascoded differential amplifier 204, 205 is provided for one differential signal (relative phase 0°) of two differential signals through transistor 201. Total structure of active quadrature signal generator 200 has a differential structure.

In FIG. 2a, nodes 224, 225 and 233 serve to define necessary bias voltage levels. A node 226 and a transistor 203 serve to supply necessary bias current. Resistors 227 and 228 serve to signal-blocking resistors. An output differential signal of the voltage-controlled oscillator is inputted via the nodes 222 and 223, which is then multiplied by the transconductance of the transistors 201 and 202 to change to a differential signal current. The differential signal current flows separately into a load having a low-pass filter characteristic including resistors 211 and 215, and condenser 210 and 214, and a load having a high-pass filter characteristic including resistors 212 and 216, inductors 213 and 217 and P type transistors 208 and 209. At this time, the P type transistors 208 and 209 are driven in a triode region. The P type transistors 208 and 209 are each connected to the resistors 212 and 216 in parallel to serve as variable resistors. The nodes 218, 219, 220 and 221 are output nodes of each of the quadrature signals. The transistors 204, 205, 206 and 207 serve to increase the degree of stability of the circuit by separating the input unit and the output unit. In FIG. 2b, the capacitor 234 and the resistor 235 constitute a low-pass filter, and the inductor 237 and the resistor 236 constitute a high-pass filter.

In order to examine the amplitude and the phase between the low-passed signal and the high-passed signal, and obtain conditions for a quadrature phase relationship, an output voltage of the nodes 238 and 239 can be expressed as $V_{OL}=i_D \times R_C/(1+sC_dR_C)$, $V_{OH}=i_d \times sR_L L_d/(sL_d+R_L)$. Where, $V_{OL}$ is an output voltage at the node 238 of the low-pass filter and $V_{OH}$ is an output voltage at the node 239 of the high-pass filter. Assuming that the quality factor of the low-pass filter is $Q_L$ and the quality factor of the high-pass filter is $Q_H$, $Q_L=\omega C_d R_C$ and $Q_H=R_s/\omega L_d$. In order to produce the quadrature signal, first, it is required that $$R_c/\sqrt{1+Q_L^2} = R_L\sqrt{1+Q_H^2}$$

since $V_{OL}=V_{OH}$. Second, $\tan^{-1}\omega C_d R_d = \tan^{-1}\omega L_d/R_s$, in other words, $Q_L \times Q_H = 1$ be satisfied since the difference in the phase of $V_{OL}$ and $V_{OH}$ is 90°. Therefore, if the values of the resistors 235 and 236, the inductor 237, and the capacitor 234 are determined so that the above two conditions are satisfied, $V_{OL}$ and $V_{OH}$ output the signals having same amplitude and quadrature phase relationship. In actual, however, an error exists in the quadrature phase relationship and its amplitude are different due to processing error in the passive devices. Therefore, they must be corrected using the variable resistors and the variable capacitors.

In FIG. 2a, the PMOS transistor in the triode region and the resistors are connected in parallel to apply a controlled voltage to a gate of the PMOS transistor via the node 230, thus varying the effective resistor value. Examining the flow of the signal in FIG. 2a, a signal of the relative phase 0° between the differential signals inputted through the nodes 222 and 223 is multiplied by the transconductance of the transistors 201, so that it is converted to a signal current. The signal current flows into the load 231 having low-pass filter characteristic including the capacitor 210 and the resistor 211 and the load 232 having high-pass filter characteristic including the PMOS transistor 208, the resistor 212 and the inductor 213, respectively, via the cascoded transistors 204 and 205. At this time, if the values of the passive elements each constituting the low-pass load and the high-pass load are set to satisfy the above first and second conditions, the quadrature signals having difference in the phase by 90° are outputted from the nodes 218 and 219, respectively. Also, if the signal having the relative phase of 180° between the differential signals inputted through the nodes 222 and 223 repeats the above process using the transistors 202, 206 and 207, the quadrature signal having difference in the phase of 90° is produced from the nodes 220 and 221. Thus, as they have the differential structure, the quadrature signals having the relative phases of four phase including 0°, 90°, 180° and 270° are generated from the nodes 218, 219, 220 and 221, respectively. Actually, it is required that the parasitic capacitance between the drain and the gate of the transistors 204, 205, 206 and 207 be considered. In order to reduce the effect of the parasitic capacitance, it is required that a transistor having a small size be used. As this has effects isolating the input portion and the load portion having the filter characteristic, unnecessary feedback signals are reduced to contribute to the stability of the circuit.

Figure 3:
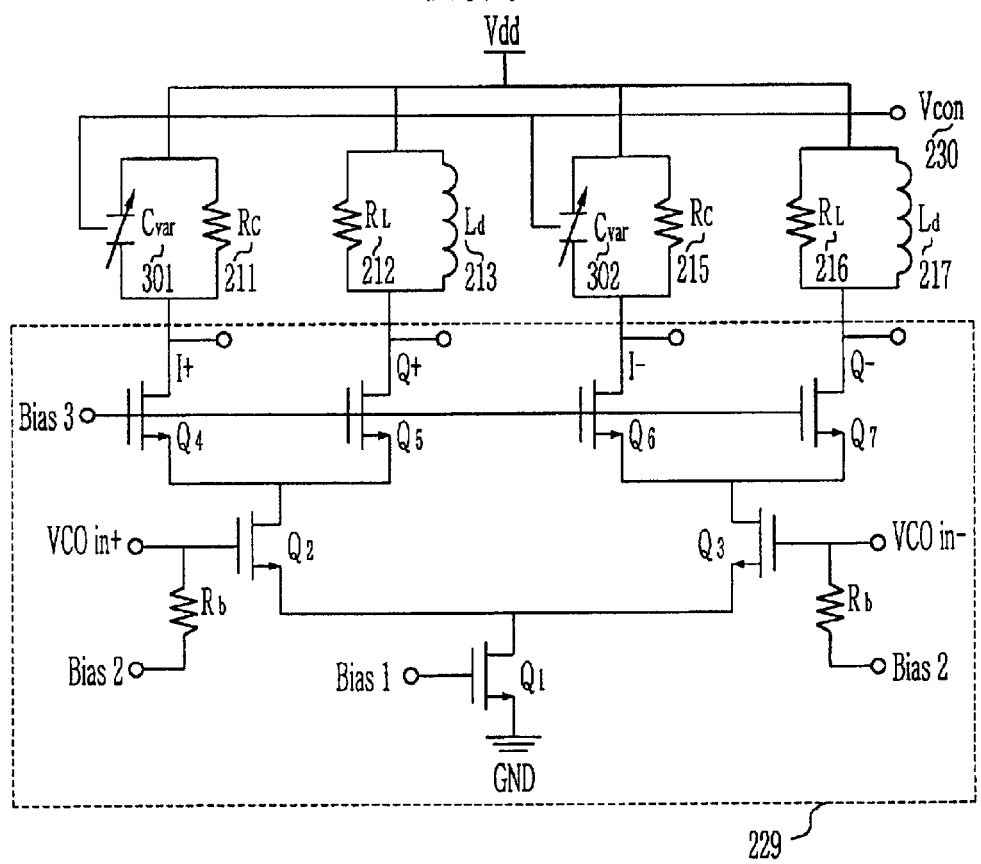
FIG. 3 is a circuit diagram of an active poly-phase quadrature signal generator using a variable capacitor according to an embodiment of the present invention.
Figure 4A:
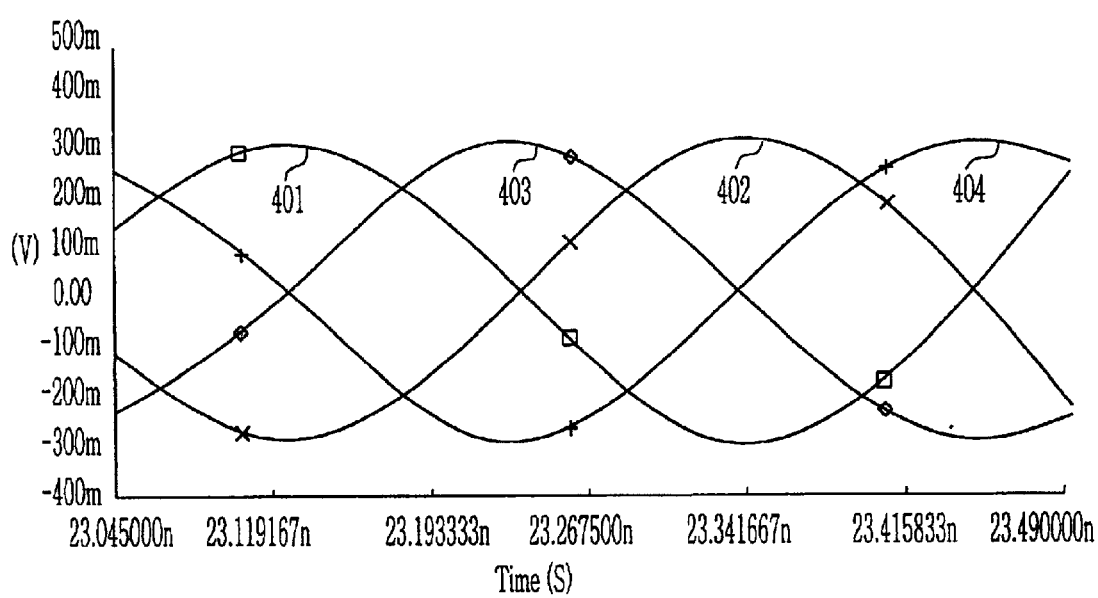
Figure 4B:
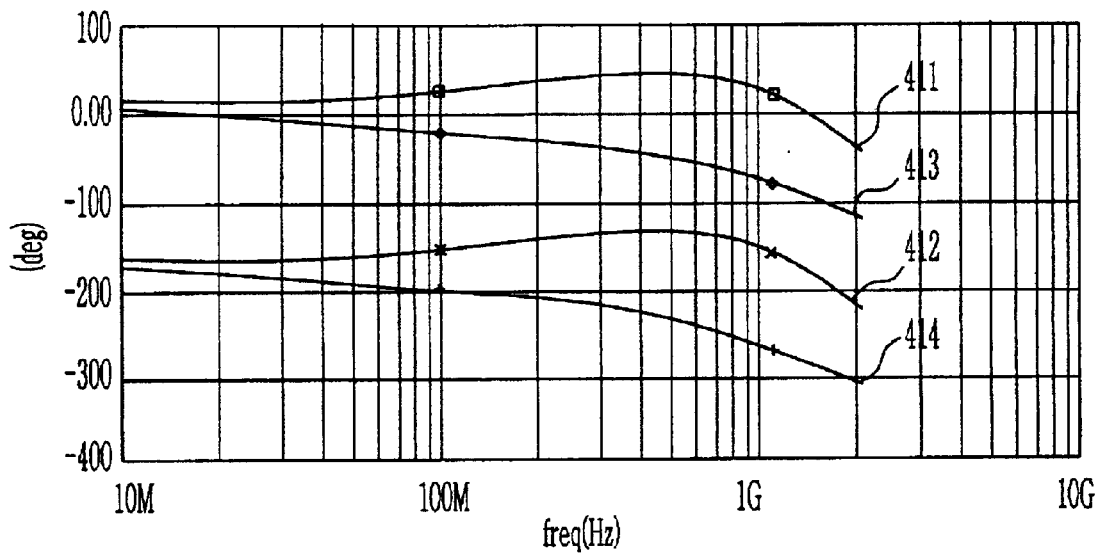
Figure 4C:
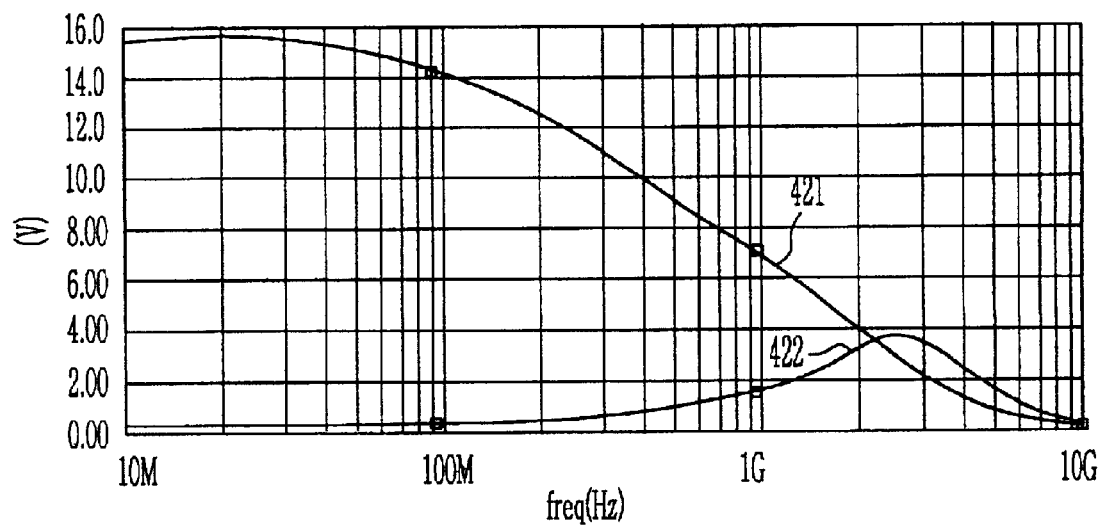

FIG. 3 is a circuit diagram in which the load of low-pass filter characteristic in FIG. 2 is replaced with variable capacitors 301 and 302 instead of the capacitor. FIG. 4 illustrates one example that poly-phase quadrature signals (I-signal and Q-signal) are generated using the circuit in FIG. 2a, wherein FIG. 4a illustrates the poly-phase quadrature signal for WCDMA of 2.33 GHz produced by a CAD simulation experiment. FIG. 4b shows amplitude response depending on the frequency and FIG. 4c shows phase response depending on the frequency. In FIG. 4a, the signal waveforms 401 and 402 indicate the I-signal having the relative phases of 0° and 180°, and the signal waveforms 403 and 404 indicate the Q-signal having the relative phases of 90° and 270°. A simulation experiment using the transistors and the passive device model considering the parasitic components at a radio frequency(RF) band shows that the error in the amplitude is about less than 1%. In FIG. 4b, the waveforms 411 and 412 indicate the phases of the I-signal and the waveforms 413 and 414 indicate the phases of the Q-signal. Though the phase error is within about 0.1°, it is expected that an actual error will be higher due to a manufacturing process error. Further, as can be seen from the amplitude characteristics depending on the frequency, load characteristics is different between the low-pass filter characteristics(waveform 421) and the high-pass filter characteristics(waveform 422). Therefore, the degree of coupling to the load of low-pass filter is higher than the degree of coupling to the load of high-pass filter by about 40 dB at the low frequency. On the contrary, at the high frequency, the degree of coupling to the load of high-pass filter is higher than the degree of coupling to the load of low-pass filter. Consequently, the amplitude error and phase error between the I-signal and the Q-signal are generated due to different modulation effect by the leakage coupling at each of the loads. In particular, in the frequency mixer serving as a core function in the high frequency communication system, the low frequency coupling is predominant at the receiver due to down-converting of the frequency. And this causes an offset problem due to a effect of modulating an LO signal. Further, this generates high frequency components to degrade the linearity. Therefore, there is a need for a quadrature signal generator having a bandpass characteristic through which only desired bands are passed, which can be implemented using a bandpass resonator.

Figure 5A:
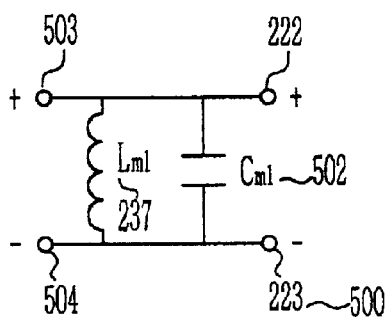
FIG. 5a is a circuit diagram of a first order bandpass resonator only having capacitor and inductor in order to reduce the error in the phase and amplitude between quadrature signals depending on the low frequency and high frequency coupling of the poly-phase quadrature signal generated in FIG. 2a and FIG. 3.
Figure 5B:
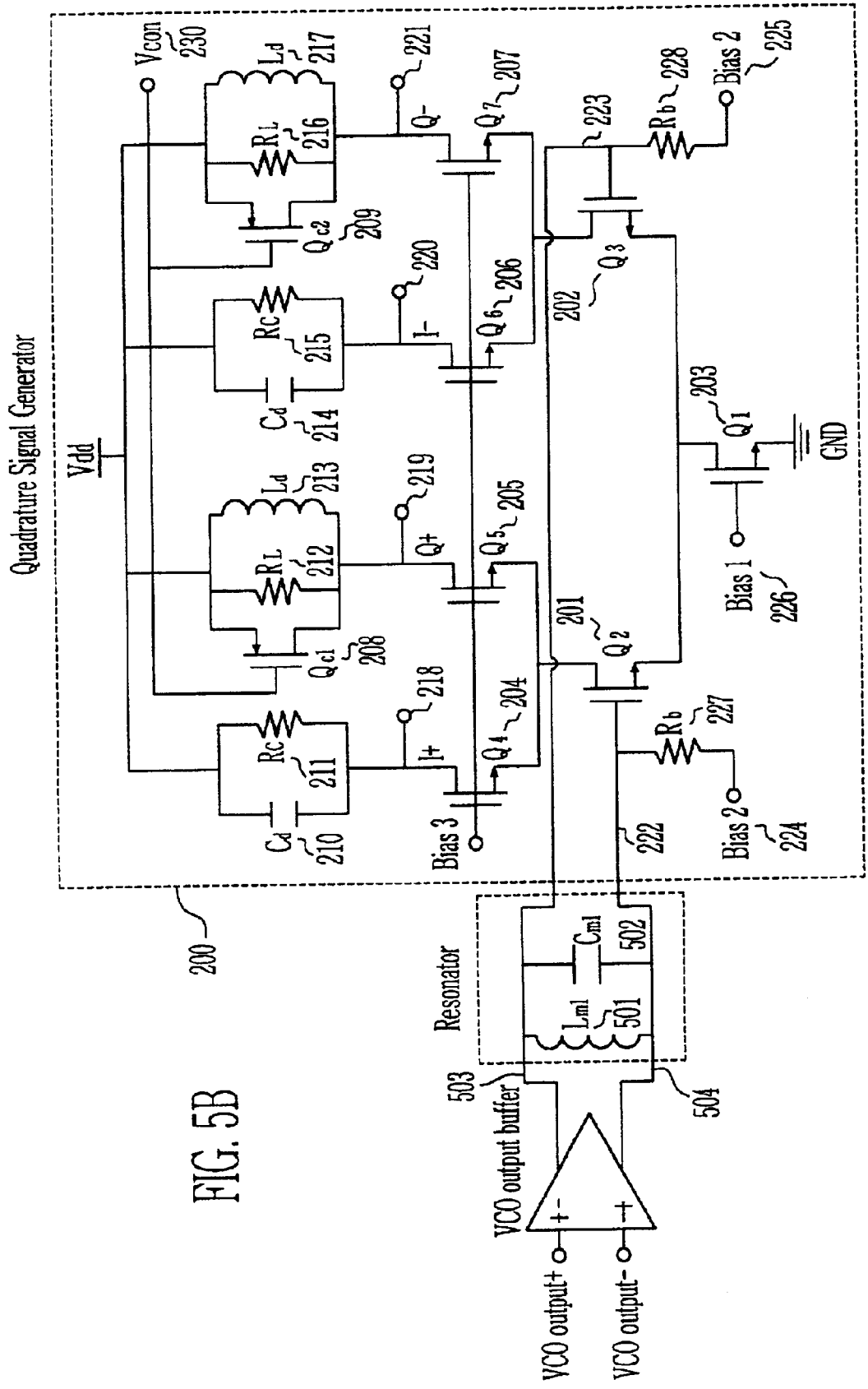
FIG. 5b is a circuit diagram of a quadrature signal generator having a bandpass characteristic including a bandpass resonator and a buffer circuit according to an embodiment of the present invention.

FIG. 5a illustrates a first order bandpass resonator of the simplest structure only having an inductor 501 and a capacitor 502. Nodes 222 and 223 are the input nodes in FIG. 2a. If the inductor 501 and the capacitor 502 are selected so that the resonant frequency $\omega_r$ becomes a frequency of a quadrature signal, only desired signals are passed and signal error due to the coupling of unwanted signals can be prevented. where $\omega_r = 1/\sqrt{L_{m1}C_{m1}}$ If more accurate bandpass characteristic is required, it can be implemented using a higher order resonator. In constructing an actual circuit, it is required that a buffer circuit for increasing a signal isolation effect between the resonator and the voltage-controlled oscillator be additionally added since the output of the voltage-controlled oscillator can be unstable due to unstable load by resonance. FIG. 5b illustrates a construction in which the first order resonator having the buffer circuit, the resistors and the inductors, and a quadrature generator are coupled.

The characteristics of the amplitude depending on the frequency between the I-signal and the Q-signal, which are obtained by a CAD simulation experiment using the circuit, are shown in FIG. 6.

Figure 6A:
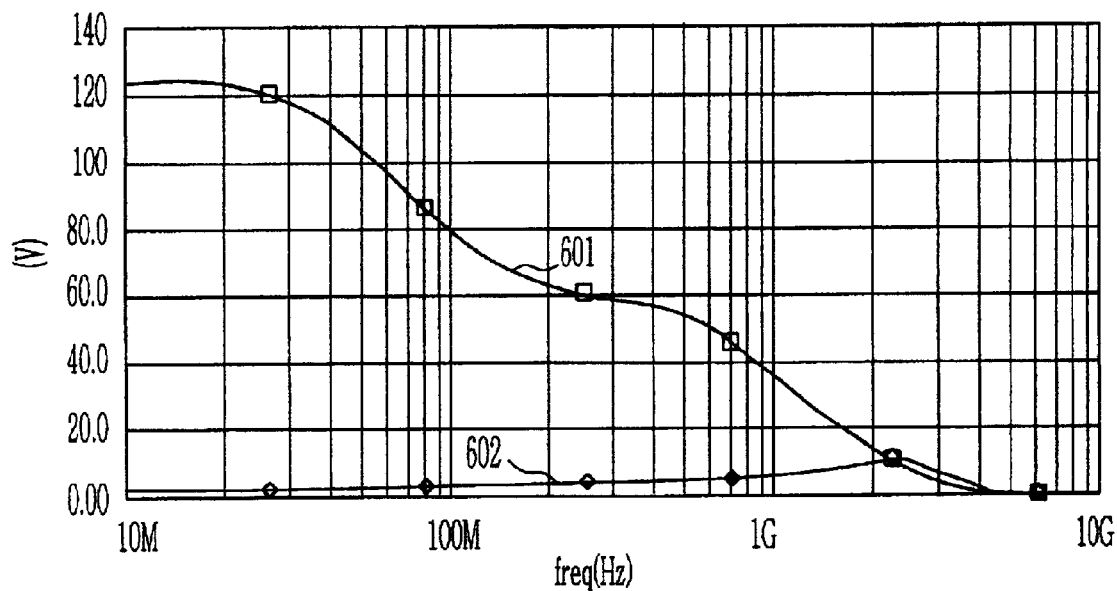
FIG. 6a is a graph showing the amplitude response depending on the frequency of the quadrature signal in case that there is no bandpass resonator in the circuit of FIG. 5b.
Figure 6B:
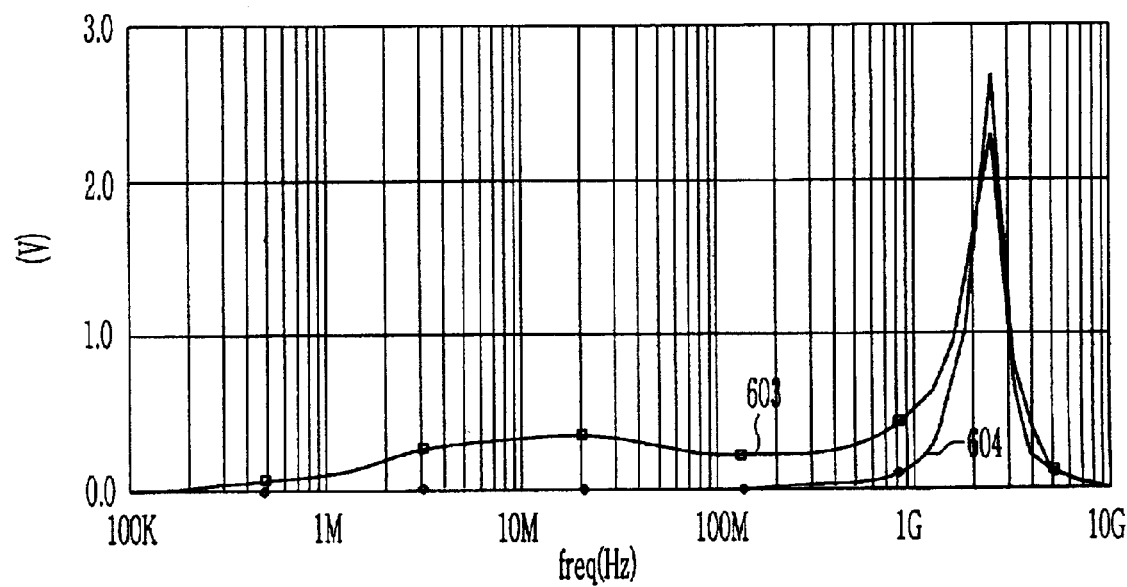
FIG. 6b is a graph showing the amplitude response depending on the frequency of the quadrature signal in case that a first order bandpass resonator is used in the circuit of FIG. 5b.
Figure 6C:
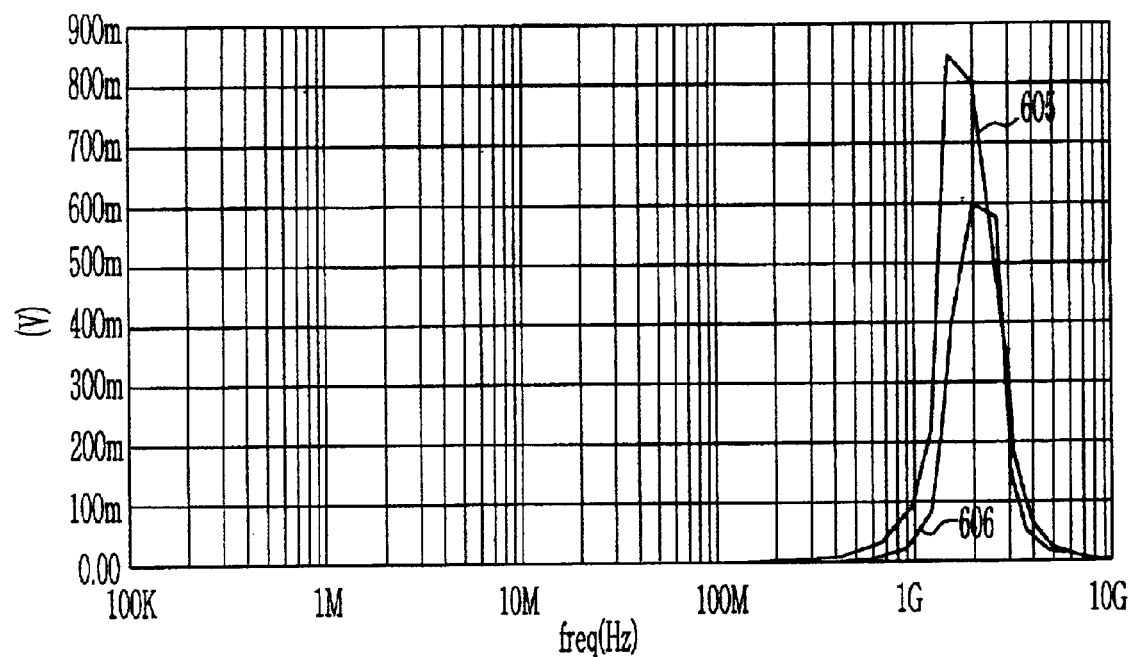
FIG. 6c is a graph showing the amplitude response depending on the frequency of the quadrature signal in case that a second order bandpass resonator is used in the circuit of FIG. 5b.

The waveforms 601 and 602 in FIG. 6a each illustrate the amplitude characteristics of the I-signal and the Q-signal when no resonators are used, the waveforms 603 and 604 in FIG. 6b illustrate the amplitude characteristics of the I-signal and Q-signal when the first order resonator is used, and the waveforms 605 and 606 in FIG. 6c illustrate the amplitude characteristics of the I-signal and the Q-signal when the second order resonator is used. The higher order the resonator is, the better the bandpass characteristic is. But, the signal attenuation due to loss of the signal through an inductor is caused. Therefore, it is required that an adequate degree of resonator be used depending on its purpose.

Figure 7A:
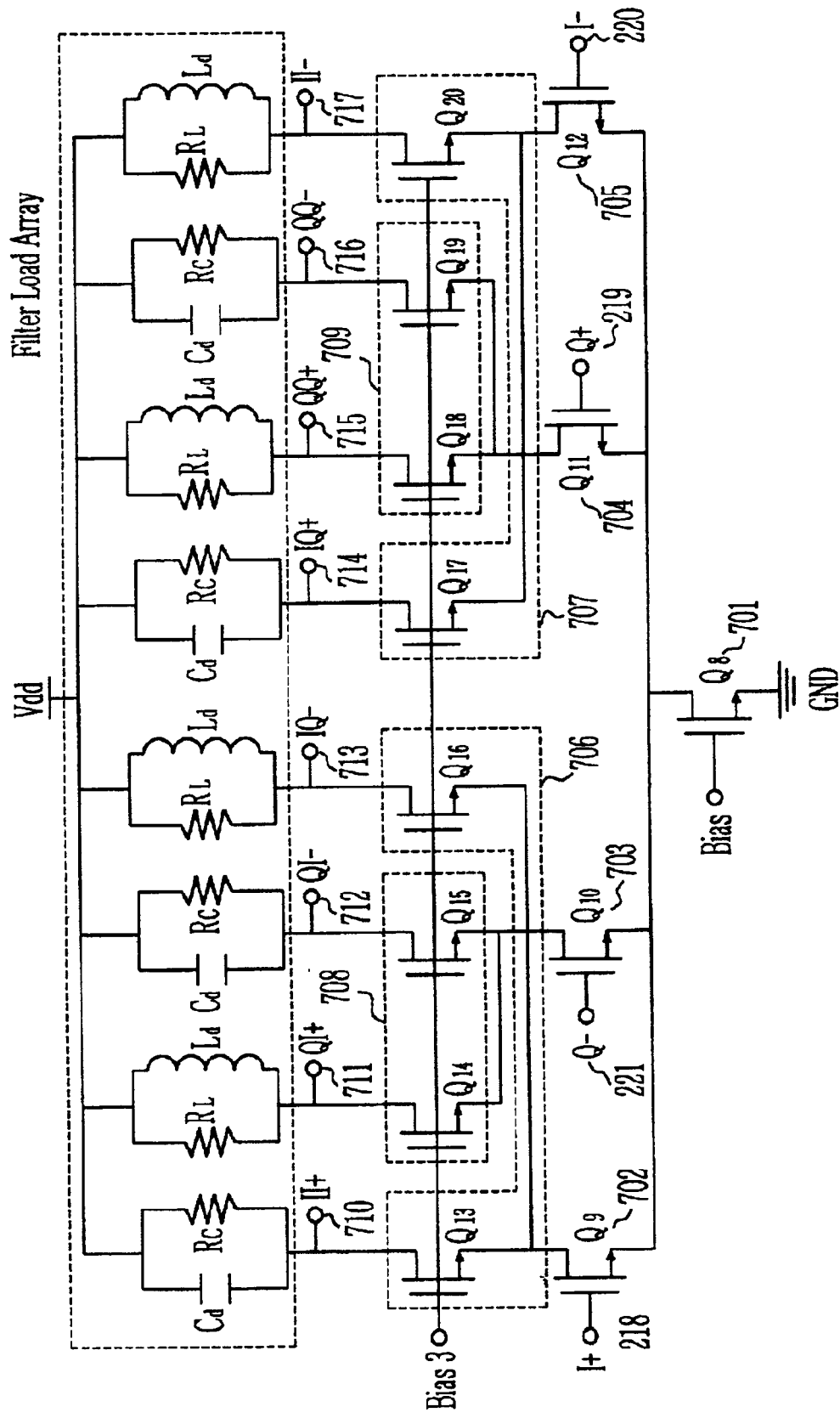
FIG. 7a is a parallel distributed cross-passing circuit for firstly correcting the phase error and the amplitude error due to different load characteristics having low-pass and high-pass characteristics in FIG. 2a and FIG. 3.
Figure 7B:
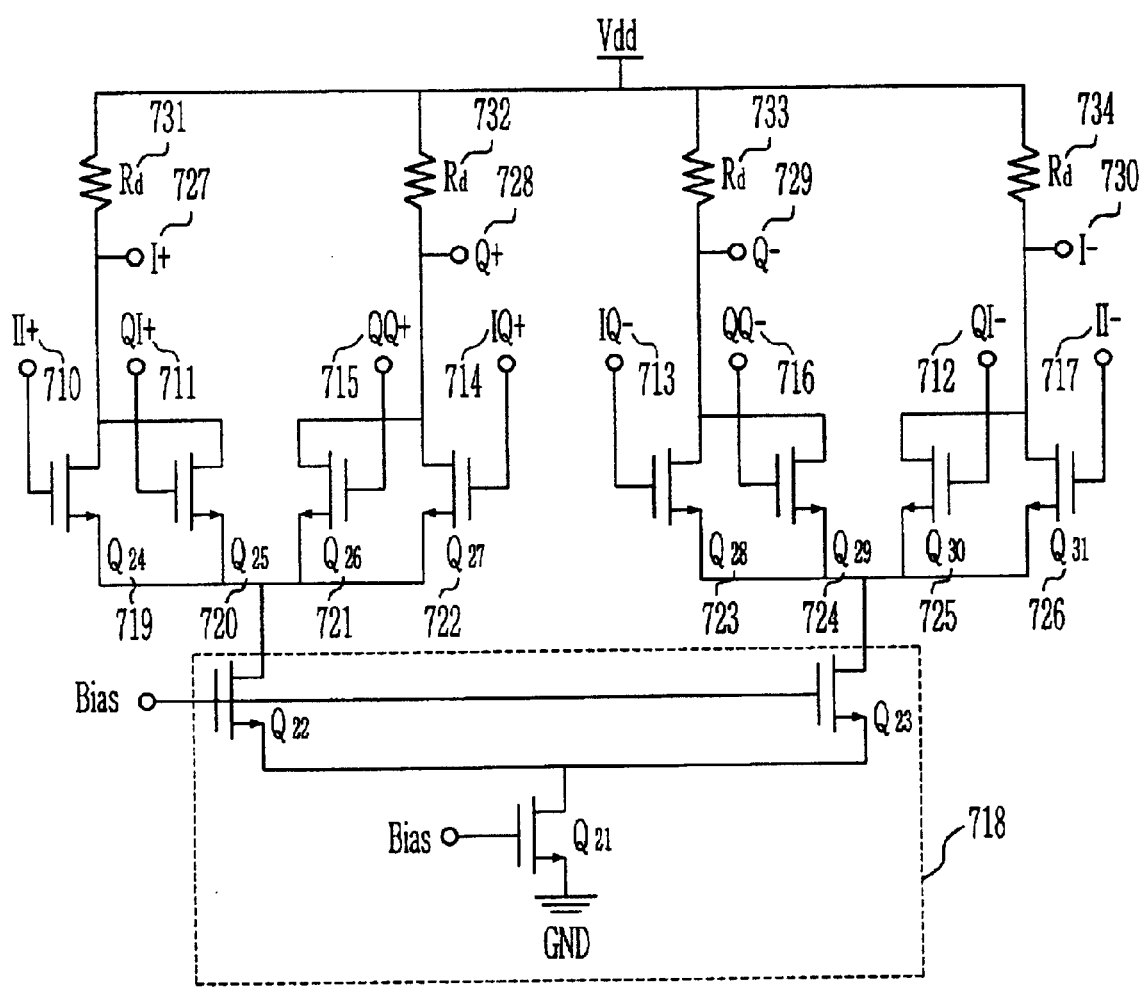
FIG. 7b is an in-phase addition circuit for adding parallel cross-passing signals which are in-phase.

FIG. 7a is a parallel distributed cross-passing circuit for offsetting the error depending on different load characteristics and reducing the error due to the processing error of passive devices and active devices. FIG. 7b shows an in-phase addition circuit to add the parallel-distributed cross-passing signals having the same phases and to give some weight. And that is a kind of circuit generating signals having the mean value. The output signal (I-signal) from the load having the low-pass filter characteristic in FIG. 2a is in parallel flowed into the load having the low-pass filter characteristic and the load having the high-pass filter characteristic through pairs of the transistors 702 and 705, and the transistors 706 and 707. Similarly, the output signal (Q-signal) from the load having the high-pass filter characteristic in FIG. 2a is in parallel flowed into the load having the low-pass filter characteristic and the load having the high-pass filter characteristic through pairs of the transistors 703 and 704, and the transistors 708 and 709. As a result, the output signal at the node 710 that was passed through the load having the low-pass filter characteristic and the output signal at the node 711 that was passed through the load having the high-pass filter characteristic become in-phase, and are converged in the node 727 through the transistors 719 and 720 in FIG. 7b. At this time, the weight to be multiplied is expressed as the multiplication of the transconductance of each of the transistors 719 and 720 and of the resistor 731. The output signals at the nodes 712 and 717 in FIG. 7a are also in-phase and form a differential pair along with the signals at the nodes 710 and 711 to produce the I-signal. Then, the I-signal passed through the transistors 725 and 726 in FIG. 7b and is then converged in the node 730. The signals at the nodes 713 and 716 and the signals at the nodes 714 and 715 are also in-phase, respectively, and form a differential pair. At this time, the differential pair maintains the phase difference by 90° from the mentioned differential pair to form the Q-signal. They are then added through the transistors 721, 722, and 723, 724 in FIG. 7b. Therefore, each of the output signals from the nodes 727, 728, 729 and 730 in FIG. 7b is a signal in which all the signal passed through the load having the low-pass filter characteristic and the load having the high-pass filter characteristic is averaged, so the signal error due to their different load characteristics can be reduced and the signal error due to the processing error of the active and passive device can be reduced.

Figure 8B:
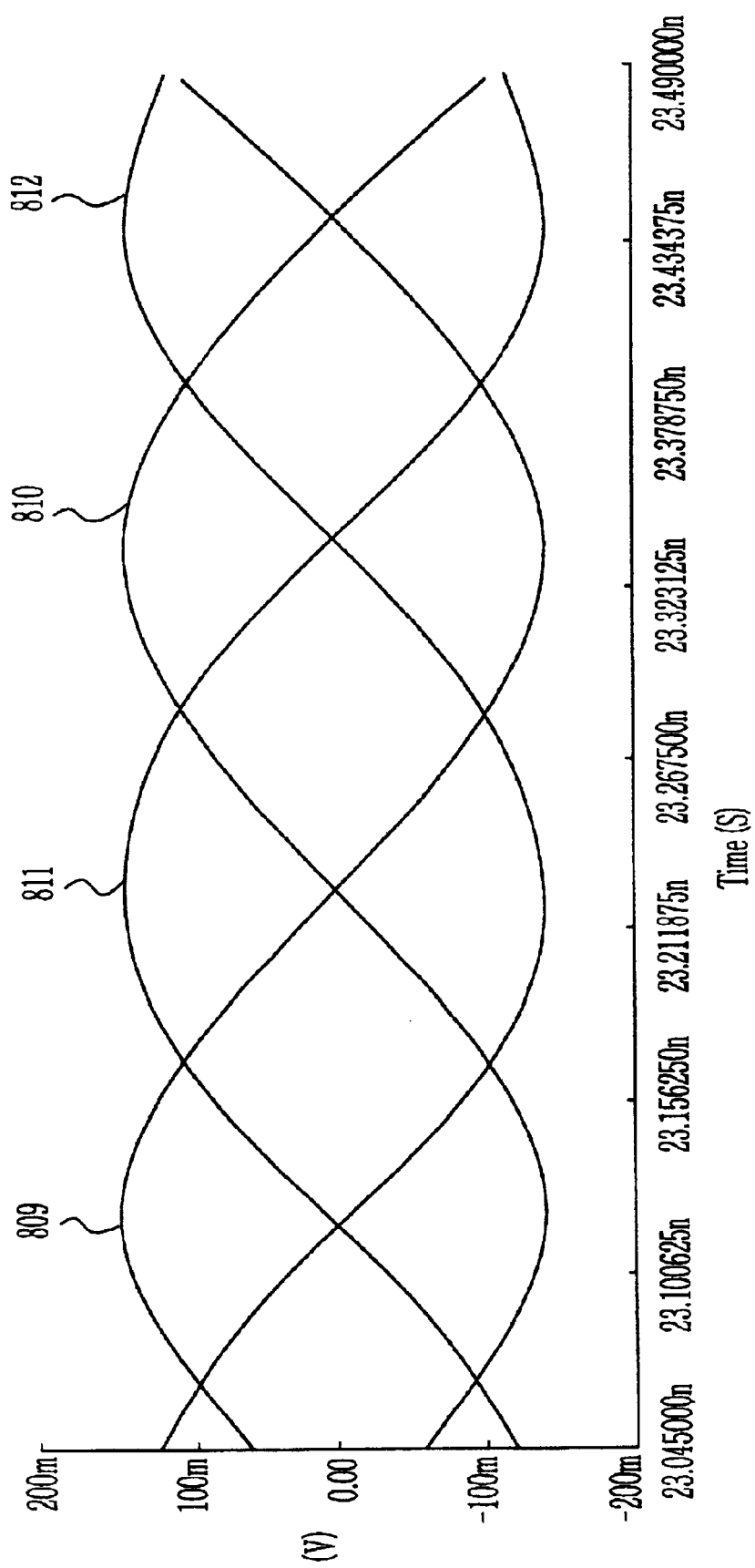
FIG. 8b is a waveform of the poly-phase quadrature signal in which the quadrature signals in FIG. 8a is added using the in-phase addition circuit in FIG. 7b.
Figure 8C:
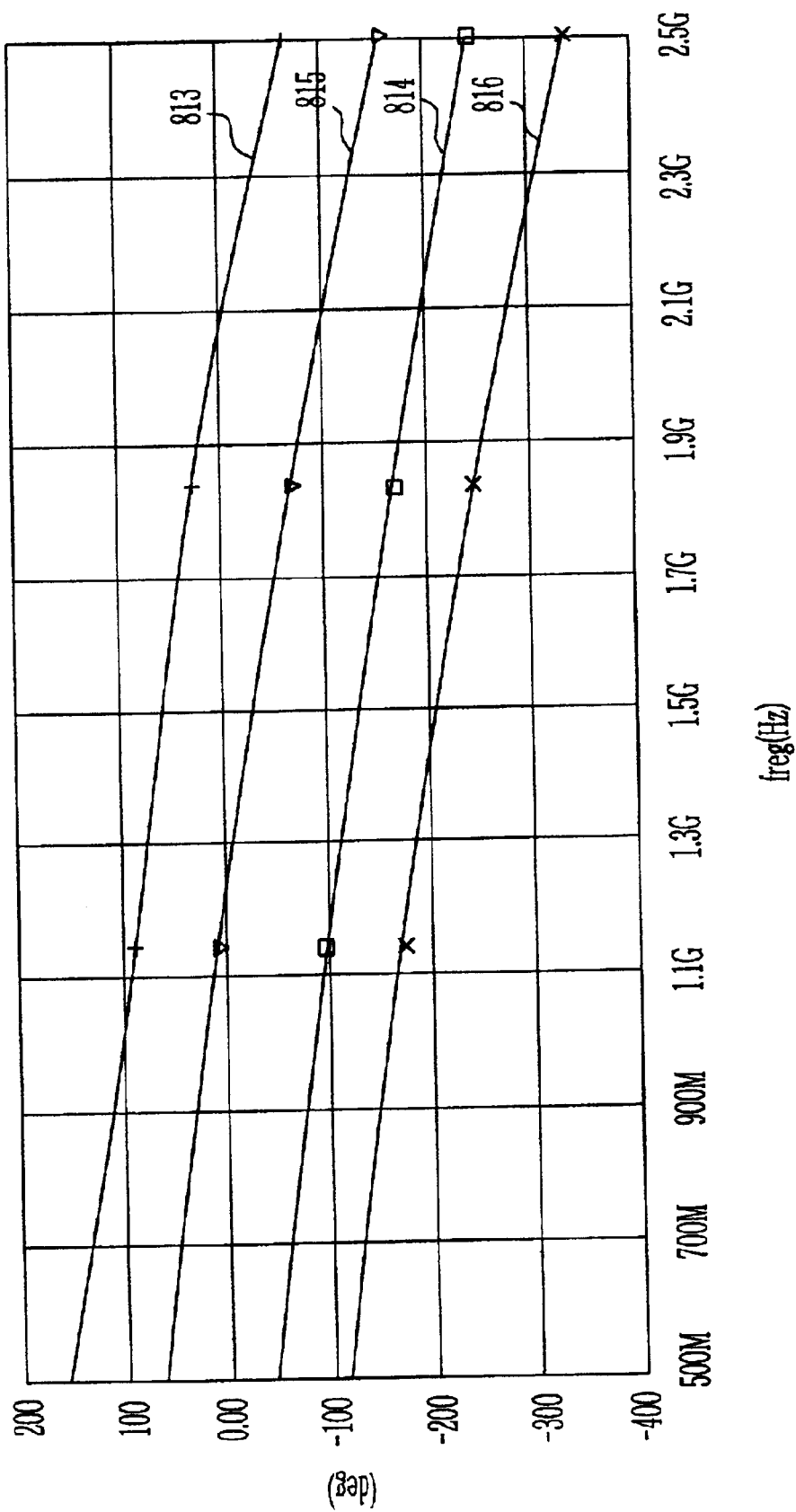
FIG. 8c is a graph showing the phase response depending on the frequency of the quadrature signal in FIG. 8b.
Figure 8D:
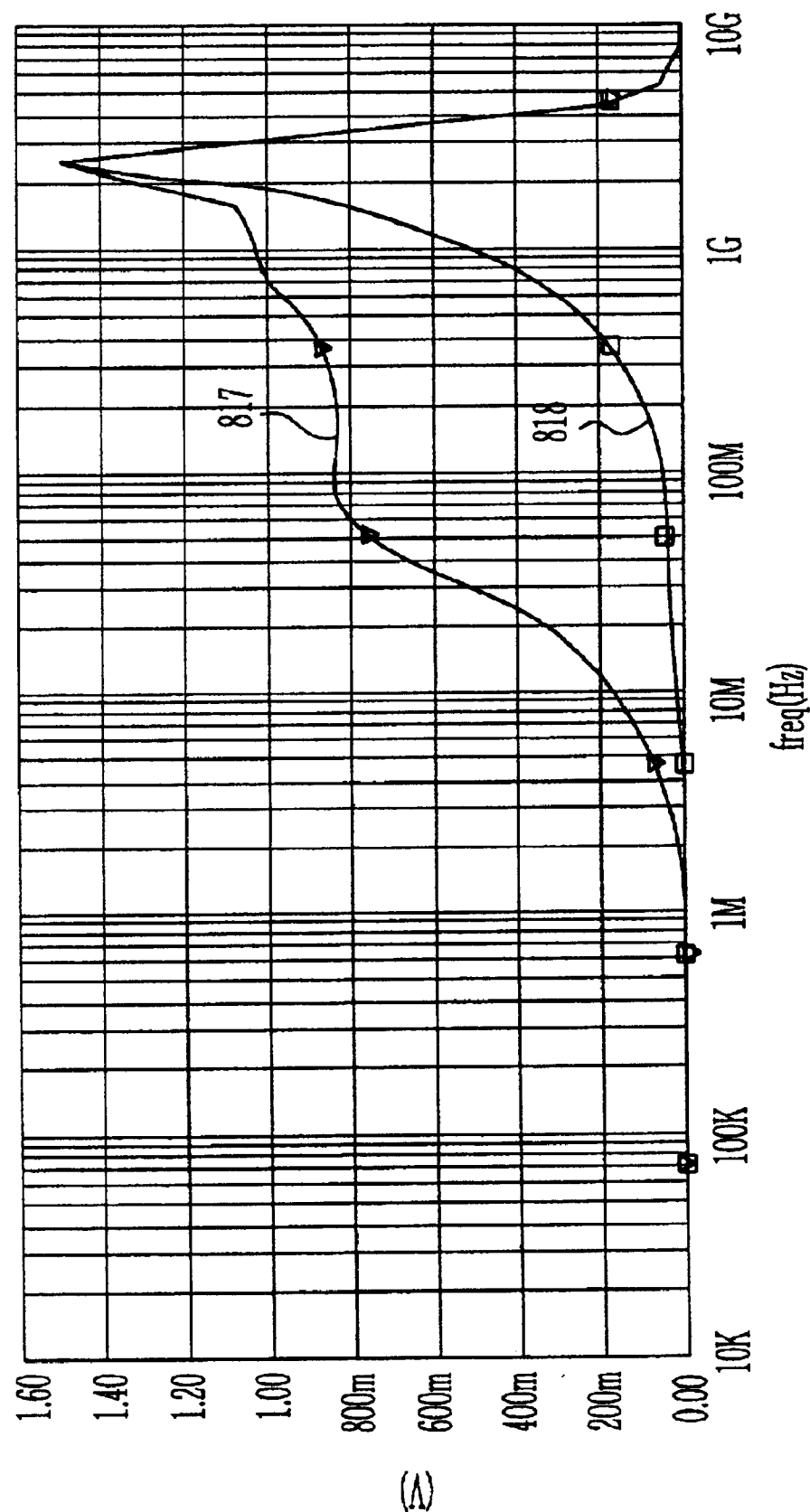
FIG. 8d is a graph showing the amplitude response depending on the frequency of the quadrature signal in FIG. 8b.

FIG. 8 illustrates a result of the quadrature signal for WCDMA of 2.33 GHz that is generated through the CAD simulation experiment, in case that the passive devices which constitutes the load of the quadrature signal generator are varied by 10% from an optimal value, wherein the first order bandpass resonator in FIG. 5a having the resistors and the inductors, the quadrature signal generator in FIG. 2a, the parallel distributed cross-passing circuit in FIG. 7a, and the in-phase addition circuit in FIG. 7b are connected. FIG. 8a shows a waveform of an output signal of the parallel-distributed cross-passing circuit and FIG. 8b shows a signal waveform at the output of the final in-phase addition circuit. The waveforms 801 and 802 represent the output waveforms at the nodes 710 and 711, the waveform 803 and 804 represent the output waveforms at the nodes 712 and 717, the waveforms 805 and 806 represent the waveforms at the nodes 714 and 715, and the waveforms 807 and 808 represent the output waveforms at the nodes 716 and 713. In the above, signals having phase errors and amplitude errors are averaged through the in-phase addition circuit, thus reducing the error. At this time, the signal in which the signals 801 and 802 are averaged is a signal 809, a signal in which the signals 803 and 804 are average is a signal 810, a signal in which the signals 805 and 806 are averaged is a signal 811, and a signal in which the signals 807 and 808 are averaged is a signal 812. FIG. 8c and FIG. 8d illustrate the amplitude characteristics and phase characteristics depending on the frequency of the signal waveform in FIG. 8b. The waveforms 813 and 814 are the phase response of the signal waveforms 809 and 810 representing the I-signal, and the waveforms 815 and 816 are the phase response of the waveforms 811 and 812 representing the Q-signal, which maintain the phase difference of 90° between the Q-signal and I-signal. The waveform 817 in FIG. 8d represents the amplitude response of the I-signal and the waveform 818 represents the amplitude response of the Q-signal. Though the waveforms 817 and 818 are exactly match in at the high frequency region and the low frequency region, they are different in the intermediate frequency region, which can be reduced by using higher order resonator.

Figure 9:
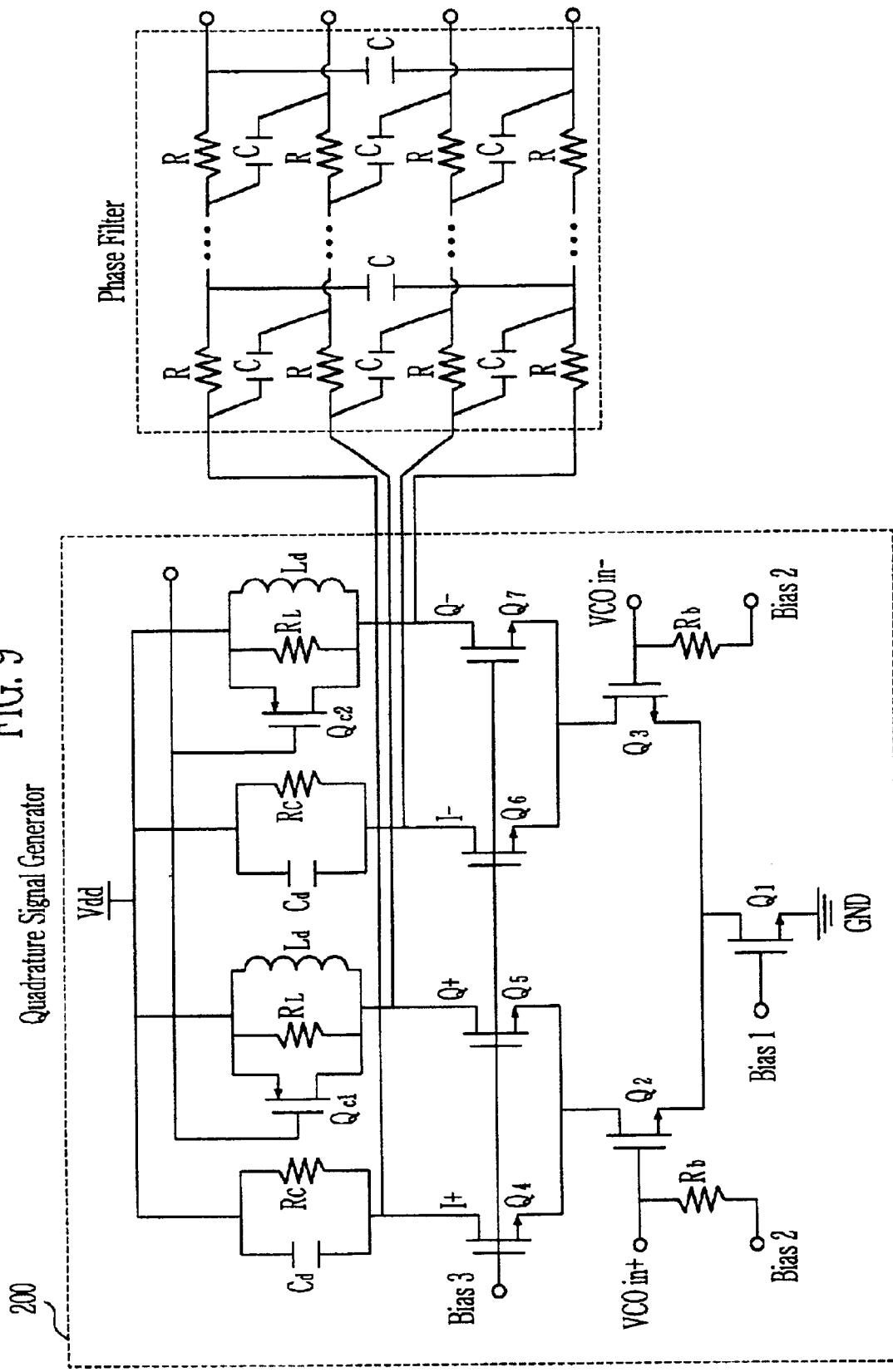
FIG. 9 is a circuit diagram in which the poly-phase quadrature signal generator according to an embodiment of the present invention and the conventional passive poly-phase quadrature filter are coupled for correcting errors in the amplitude and the phase between generated quadrature signals.

FIG. 9 is another circuit diagram for correcting the signal error (amplitude error and phase error) between the quadrature signals (I-signal and Q-signal), which shows a structure in which the quadrature signal generator in FIG. 2a and an existing poly-phase quadrature filter are coupled. The poly-phase quadrature filter being a passive circuit network has attenuation of a signal. However, this attenuation can be overcome using the quadrature generator being the active circuit network. The signal error of the quadrature generator can be reduced using a simple passive circuit network having no additional power consumption.

Figure 10A:
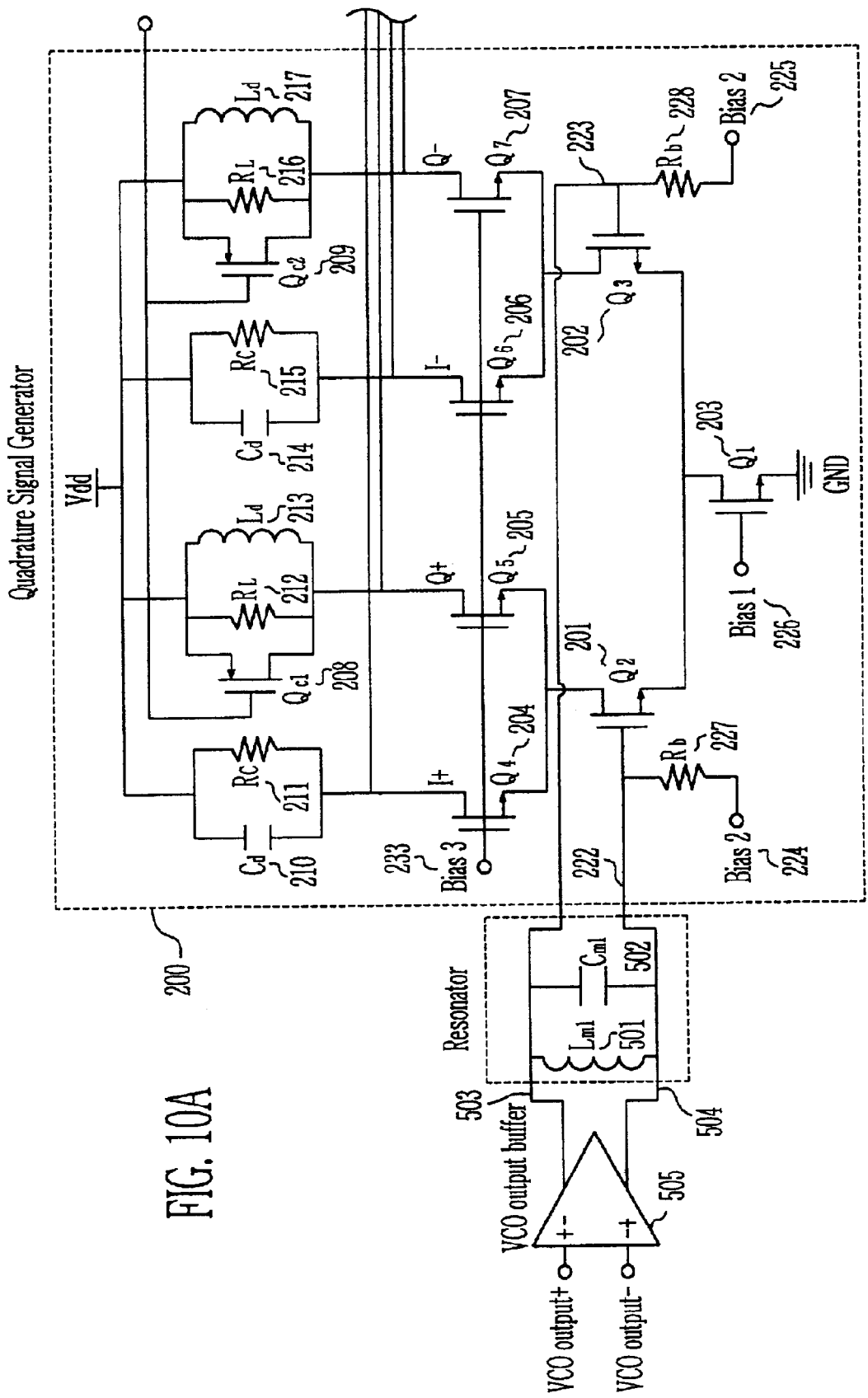
FIG. 10a and FIG. 10b is a feedback block diagram of the single balanced structure for correcting errors in the phase and the poly-phase quadrature signal generator according to an embodiment of the present invention.
Figure 10B:
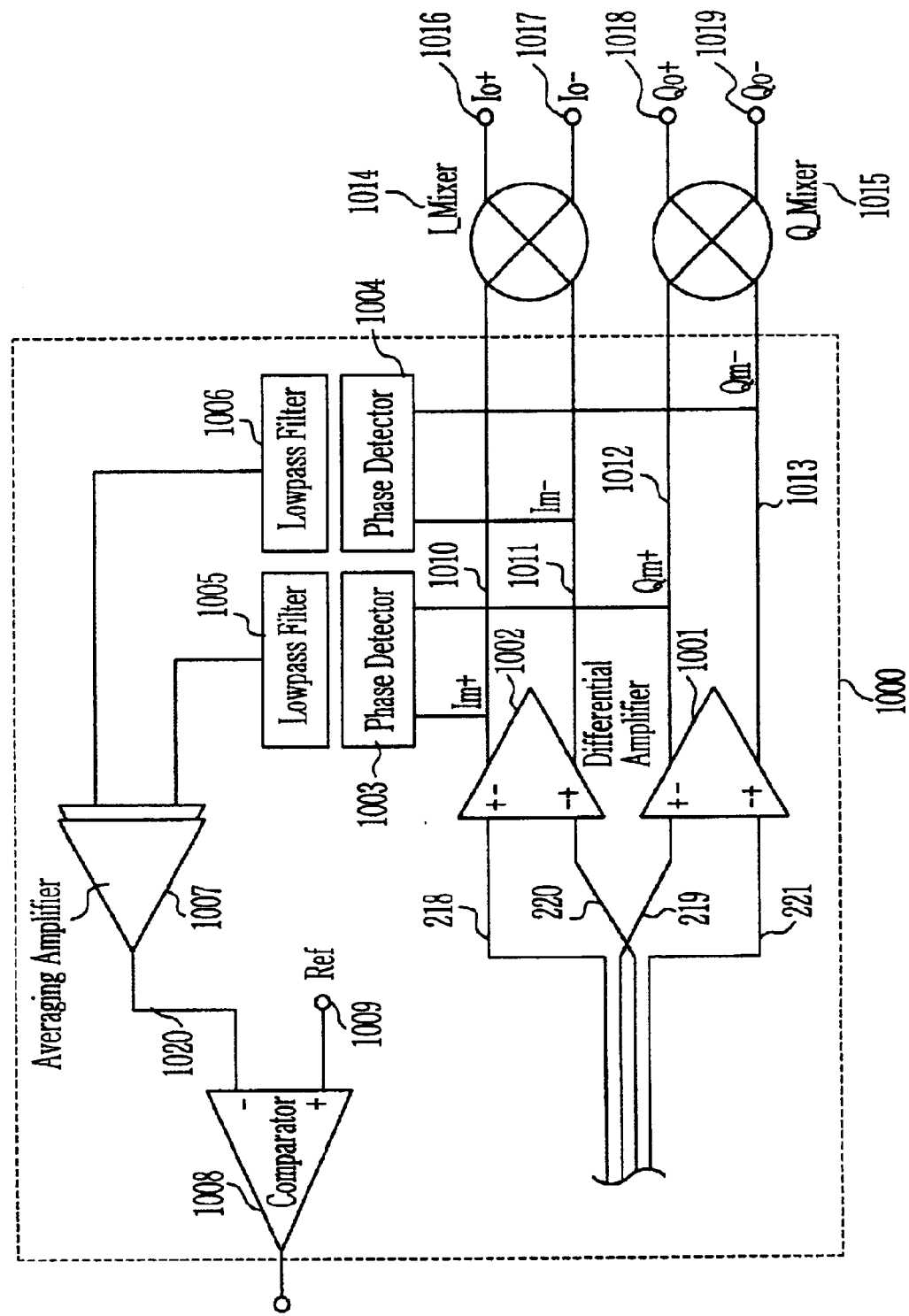

FIG. 10a and FIG. 10b is a block diagram of phase control system 1000 in which the phase error between the quadrature generator and the quadrature signal is corrected more accurately. The quadrature signal produced by the quadrature generator passes through the differential amplifiers 1001 and 1002 acting as a buffer through the output nodes 218, 219, 220 and 221. Then, the quadrature signal is inputted to a pair of quadrature frequency mixer 1014 and 1015. At this time, the signal at the nodes 1016 and 1017 is frequency-converted I-signal (in-phase signal), and the signal at the nodes 1018 and 1019 is frequency-converted Q-signal (quadrature-phase signal). It should be noted that the phase detectors 1003 and 1004 can be implemented using a common multiplier and the low-pass filters 1005 and 1006 can be implemented using simple resistors and condenser. Further, the mean amplifier 1007 can be implemented using the same method of the in-phase addition circuit in FIG. 7b. The comparator can be implemented using a common differential amplifier.

In order to examine a feedback process by which the phase error between the quadrature signals are corrected will be now described, assuming that the I-signal at the nodes 1010 and 1011 is $A\cos\omega t$ and the Q-signal at the nodes 1012 and 1013 is $(A+\delta)\sin(\omega t+\nabla\Phi)$. At this time, $\delta$ indicates the amplitude error between the two difference quadrature signals and $\nabla\Phi$ indicates the phase error. These two signals are inputted to an input of the phase detector and the output signal of the phase detector is represented as $\frac{1}{2}A(A+\delta)\{\sin(2\omega t+\nabla\Phi)+\sin\nabla\Phi\}$. If these signals are passed through the low-pass filter and the mean amplifier, the output signal of the node 1080 is represented as $\Im\sin\nabla\Phi$, wherein $\aleph$ and $\Im$ are circuit constants at each of the outputs. Therefore, the magnitude of the output signal of the comparator are greatly varied depending on the magnitude of the error signals $\Im \sin \nabla\Phi$. The phase error can be corrected by controlling the gate voltage of the PMOS transistor driven at the triode region using this signal voltage.

Figure 11:
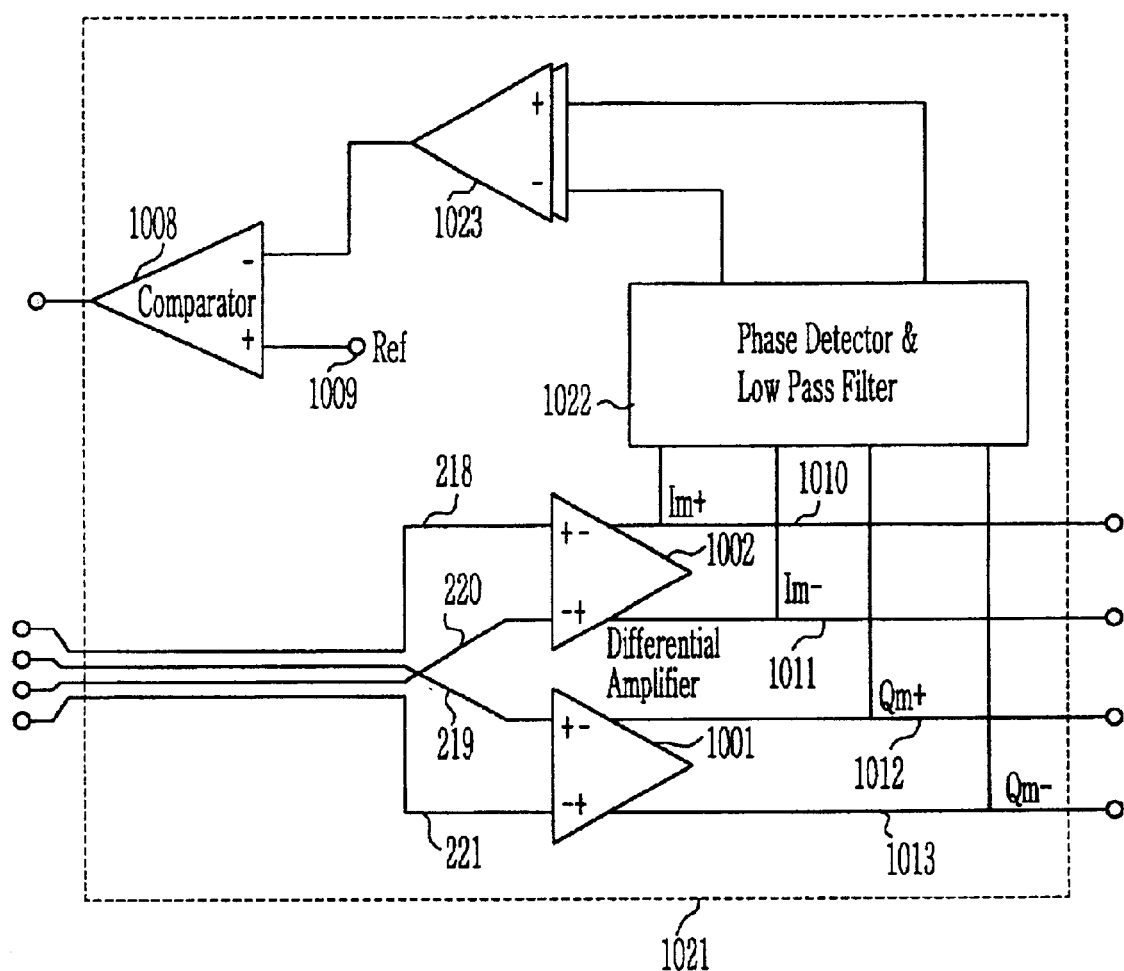
FIG. 11 is a block diagram in which the single balanced feedback loop for correcting errors in the phase in FIG. 8 is replaced with a double balanced feedback loop structure.

Through the above explanation illustrate a method by which sensing the phase error and the output of the error signal accordingly are constructed to be a single balanced phase detector and respective output signals are averaged. However, it can be constructed to be the double balanced phase detector if Gilbert multiplier is used. In this case, D2S (differential to single) for converting the differential output signal into a single signal is required. An embodiment of which is illustrated in FIG. 11. A reference numeral 1022 indicates the phase detector of a dual balanced structure and the low-pass filter, and a reference numeral 1021 indicates a block diagram of D2S.

As mentioned above, according to the present invention, the load having low-pass filter characteristic and the load having high-pass filter characteristic are used as the load of an amplifier and phase delay characteristics in each of the loads are thus used to produce amplified quadrature signals. Therefore, the present invention can solve a signal attenuation problem that is native in a circuit only including conventional passive devices. Further, the present invention can be effectively implemented in a radio frequency(RF), microwave and millimeter-wave regions by use of an inductor instead of only using resistors and capacitors. In addition, the present invention can control the phase error accurately by constructing resistors and condensers constituting respective loads using a variable resistors or a variable condensers.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. An active quadrature signal generator, comprising:
   a pair of different connected transistors (201,202), wherein each of two differential signals (VCO in+, VCO in−) having different relative phases are inputted into each of the input terminals of the pair of the transistors and converted to differential current signals;
   two pairs of cascoded differential amplifiers (204,205,206 and 207), each pair of which is connected to generate two phase quadrature signals between respective outputs of the pair of transistors (201,202) and two output terminals (218, 219, 220 and 221) of active quadrature signals: and
   two pairs of low pass filters and high pass filters (231, 232, . . . ), wherein each pair of the low pass filter and high pass filter is connected between output terminals (218, 219, 220 and 221) of the active quadrature signals and supply voltage (Vdd), the low-pass filter including a resistor and a capacitor, the high-pass filter including a resistor and an inductor.

2. The active quadrature signal generator as claimed in claim 1, wherein the values of the resistors and the capacitors in the low-pass filters are varied depending on the amount and phase of the active quadrature signals and wherein the values of the resistors in the high-pass filters are varied depending on the amount and phase of the active quadrature signals.

3. The active quadrature signal generator as claimed in claim 1, further including a resonator of a bandpass characteristic connected to the input terminals of the pair of the differential connected transistors for receiving the two differential signals (VCO in+, VCO in−), the resonator having capacitors and inductors.

4. The active quadrature signal generator as claimed in claim 1, further including a poly-phase quadrature filter connected to the outputs (218, 219, 220 and 221) of the active quadrature signal generator.

5. The active quadrature signal generator as claimed in claim 1, further including a phase control means for controlling the values of the resistors in the high-pass filters in order to finely control the phase error of the active quadrature signals.

6. The active quadrature signal generator as claimed in claim 5, wherein said phase control means includes:
   a phase sensing means of a single parallel structure for sensing the difference in the phases between a relative phase 0° and a relative phase 90° or a relative phase 180° and a relative phase 270° among the active quadrature signals;
   low-pass filters for removing high frequency portions from the signals outputted from the phase sensing means;
   an averaging circuit for adding by weight signals outputted from the low-pass filters; and
   a comparator circuit for comparing the output signal from the averaging circuit and a reference voltage to produce a voltage for controlling the valves of the resistors in the high-pass filters.

7. The active quadrature signal generator as claimed in claim 5, wherein said phase control means includes:
   a phase sensing means of a dual balanced structure capable of sensing the difference in the phases between the relative phase 0° and the relative phase 90° or the relative phase 180° and the relative phase 270° among the active quadrature signals;
   a low-pass filter for removing a high frequency portion of the signal outputted from the phase sensing means;
   a means for converting the differential output signal from the phase sensing means and the low-pass filter into a single output signal; and
   a comparator circuit for comparing the output signal from the means and a reference voltage to produce a voltage for controlling the valves of the resistors in the high-pass filters.

8. The active quadrature signal generator as claimed in claim 1, wherein the two differential signals have relative phase 0° and 180°, respectively.

* * * * *